United States Patent
Jan et al.

(10) Patent No.: US 6,835,636 B2
(45) Date of Patent: Dec. 28, 2004

(54) METHOD FOR FABRICATING SOURCE/DRAIN DEVICES

(75) Inventors: Yi-Tsung Jan, Taipei (TW); Wen-Tsung Wang, Taipei (TW); Sung-Min Wei, Hsinchu (TW); Chih-Cherng Liao, Hsinchu (TW); Zhe-Xiong Wu, Hualien (TW); Mao-Tsang Chen, Taoyuan (TW); Yuan-Heng Li, Taipei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 140 days.

(21) Appl. No.: 10/315,980

(22) Filed: Dec. 11, 2002

(65) Prior Publication Data

US 2004/0043589 A1 Mar. 4, 2004

(30) Foreign Application Priority Data

Aug. 30, 2002 (TW) ........................................ 91119777 A

(51) Int. Cl.$^7$ ................. H01L 21/3205; H01L 21/4763; H01L 21/44; H01L 21/265; H01L 21/336
(52) U.S. Cl. ...................... 438/585; 438/585; 438/605; 438/519; 438/305
(58) Field of Search .................... 438/585, 588, 438/605, 519, 530, 548, 301, 305, 308

(56) References Cited

U.S. PATENT DOCUMENTS

| | | | | |
|---|---|---|---|---|
| 6,136,686 A | * | 10/2000 | Gambino et al. | 438/624 |
| 6,274,468 B1 | * | 8/2001 | Hsu | 438/586 |
| 6,391,689 B1 | * | 5/2002 | Chen | 438/135 |
| 6,690,084 B1 | * | 2/2004 | Mizuhara et al. | 257/650 |
| 6,784,047 B2 | * | 8/2004 | Tsugane et al. | 438/238 |

* cited by examiner

*Primary Examiner*—Matthew Smith
*Assistant Examiner*—Chuong Anh Luu
(74) *Attorney, Agent, or Firm*—Birch, Stewart, Kolasch & Birch, LLP

(57) ABSTRACT

A method for fabricating source/drain devices. A semiconductor substrate is provided with a gate formed on the semiconductor substrate, and a hard mask layer formed on the gate. A first doped area is formed on a first side of the gate on the semiconductor substrate, and a second doped area is formed on a second side of the gate on the semiconductor substrate in a manner such that the second doped area is separated from the gate by a predetermined distance. A patterned photo resist layer is formed on the semiconductor substrate having an opening on the second side, the exposed gate equal to half the width of the gate. The semiconductor substrate is implanted and annealed to form a dual diffusion area on the second side of the gate using the patterned photo resist layer and the hard mask layer as masks.

16 Claims, 12 Drawing Sheets

METHOD FOR FABRICATING SOURCE/DRAIN DEVICES

This nonprovisional application claims priority under 35 U.S.C. § 119(a) on Patent Application No. 091119777 filed in TAIWAN, R.O.C. on Aug. 30, 2002, which is herein incorporated by reference.

BACKGROUND OF THE INVENTION

1. Field of the Invention

The invention relates to a semiconductor process, and more particularly to a source/drain (S/D) device fabrication process used in a high voltage circuit element.

2. Description of the Related Art

FIGS. 1a to 1i are cross-sections of the conventional method for fabricating S/D device.

In FIG. 1a, a semiconductor substrate 101, such as silicon, is provided, and a first isolation area 105a and a second isolation area 105b are formed thereon. A pad layer 102, such as oxide, a conductive layer 103, such as poly, and a first patterned photo resist layer 104 are sequentially formed in the area between the first isolation area 105a and the second isolation area 105b. The area surrounding the isolation area areas is an active area (AA).

In FIG. 1b, after the conductive layer 103 is etched using the first patterned photo resist layer 104 as a mask to form a gate 103a, the first patterned photo resist layer 104 is removed. Then, the area of the semiconductor substrate 101 between the gate 103a and the first isolation area 105a is doped to form a lightly doped area 106.

In FIG. 1c, an isolating layer 107, such as nitride, is conformably formed on the surface of the pad layer 102 and the gate 103a.

In FIG. 1d, the isolating layer 107 is isotropically etched to form a spacer 107a on the sidewall of the gate 103a.

In FIG. 1e, a second patterned photo resist layer 108 having a first opening 109a and a second opening 109b is formed on the semiconductor substrate 101. The first opening 109a is positioned in the area between the gate 103a and the first isolation area 105a, and the second opening 109b is positioned in the area between the gate 103a and the second isolation area 105b.

First ion implantation is performed on the semiconductor substrate 101 using the second patterned photo resist layer 108 as a mask with As or B ions.

FIG. 2 is a top view of FIG. 1e. In FIG. 2, part of the active area and half the width of the gate 103a are exposed by the first opening 109a in the second patterned photo resist layer 108.

In FIG. 1f, a first doped area 110a is formed at the bottom of the first opening 109a and a second doped area 110b is formed at the bottom of the second opening 109b. After the first ion implantation, the second patterned photo resist layer 108 is removed.

In FIG. 1g, a third patterned photo resist layer 111 having a third opening 112 is formed on the semiconductor substrate 101, and half the width of the gate 103a is exposed by the third opening 112 in the third patterned photo resist layer 111. The third opening 112 is positioned in the area between the gate 103a and the second isolation area 105b.

Second ion implantation is performed on the semiconductor substrate 101 using the third patterned photo resist layer 111 as a mask and the semiconductor substrate 101 is annealed with As or B ions.

FIG. 3 is a top view of FIG. 1f. In FIG. 3, part of the active area and half the width of the gate 103a are exposed by the first opening 112 in the third patterned photo resist layer 111, and the area between the gate 103a and the first isolating 105a is covered with the third patterned photo resist layer 111.

In FIG. 1h, a deeply doped area 113 is formed at the bottom of the third opening 112. After the second ion implantation, the third patterned photo resist layer 111 is removed. The deeply doped area 113 is 6–7 times the depth of the first doped area 11a and the second doped area 110b. The deeply doped area 113 expands after annealing, such that the depth and the width of the deeply doped area 113 are both increased. When the deeply doped area 113 increases, the concentration of dopant inside the deeply doped area 113 decreases and the breakdown voltage of the deeply doped area 113 increases accordingly.

By varying the energy of the ions to form the deeply doped area 113 in the semiconductor substrate 101, implantation depth into the substrate can be controlled. Meanwhile, the ions also penetrate the gate 103a and the spacer 107a into the semiconductor substrate 101, and the size increases after annealing.

The channel between the S/D consisting of the first doped area 110a and another S/D consisting of the second doped area 110b and deeply doped area 113 is decreased, resulting in Short Channel Effect. When the two S/D devices are both deeply doped areas, the channel between the S/D devices below the gate 103a and spacer 107a punches through, such that electrons are injected into the channel from source region before applying a gate voltage.

SUMMARY OF THE INVENTION

The present invention is directed to a method for fabricating source/drain devices in a high voltage circuit element without additional process.

Accordingly, the present invention provides a method for fabricating a source/drain device, in which, first, a semiconductor substrate having a gate is provided. A hard mask layer is formed on the gate. A first doped area is positioned on a first side of the gate on the semiconductor substrate, and a second doped area is positioned on a second side of the gate on the semiconductor substrate and spaced between. A patterned photo resist layer having an opening on the second side of the gate is formed on the semiconductor substrate, and the exposed gate is equal to half the width of the gate. The semiconductor substrate is implanted and annealed to form a dual diffusion area on the second side of the gate using the patterned photo resist layer and the hard mask layer as masks.

Accordingly, the present invention also provides a method for fabricating source/drain devices. A silicon substrate having a gate is provided. A hard mask layer is formed on the gate. A first doped area is positioned on a first side of the gate on the silicon substrate, and a second doped area is positioned on a second side of the gate on the silicon substrate and spaced between. A patterned photo resist layer having an opening on the second side of the gate is formed on the semiconductor substrate, and the width of the exposed gate is equal to half the width of the gate. The silicon substrate is implanted and annealed to form a dual diffusion area on the second side of the gate using the patterned photo resist layer and the hard mask layer as masks.

Accordingly, the present invention also provides a method for fabricating a source/drain device. A semiconductor substrate having a pad layer over the semiconductor substrate, a gate formed on the pad layer, a hard mask layer over the gate, a first isolation area positioned on a first side of the gate, and a second isolation area positioned on a second side of the gate, is provided. The gate has a spacer on the sidewall of the gate. A first patterned photo resist layer is formed. Ions are implanted into the semiconductor substrate to form a first doped area and a second doped area using the patterned photo resist as a mask. The first doped area is positioned between the gate and the first isolation area, and the second doped area is positioned between the gate and second isolation area. A second patterned photo resist layer having an opening on the second side between the gate and the second isolation area is formed on the semiconductor substrate. The width of the exposed gate is equal to half the width of the gate. The semiconductor substrate is implanted and annealed using the patterned photo resist layer and the hard mask layer as masks to form a dual diffusion area on the second side of the gate. The second patterned photo resist layer is removed.

Accordingly, the present invention also provides a method for fabricating a source/drain device. A silicon substrate having a pad oxide layer over the semiconductor substrate, a gate formed on the pad layer, a hard mask layer over the gate, a first isolation area positioned on a first side of the gate, and a second isolation area positioned on a second side of the gate is provided. The gate has a spacer on the sidewall of the gate. A first patterned photo resist layer is formed as a mask to implant the silicon substrate to form a first doped area and a second doped area. The first doped area is positioned between the gate and the first isolation area, and the second doped area is positioned between the gate and second isolation area. The first patterned photo resist layer is removed. A second patterned photoresist layer having an opening on the second side between the gate and the second isolation area is formed on the silicon substrate. The width of the exposed gate is equal to half the width of the gate. The silicon substrate is implanted and annealed using the patterned photo resist layer and the hard mask layer as masks to form a dual diffusion area on the second side of the gate. The second patterned photo resist layer is removed.

BRIEF DESCRIPTION OF THE DRAWINGS

For a better understanding of the present invention, reference is made to a detailed description to be read in conjunction with the accompanying drawings, in which.

DETAILED DESCRIPTION OF THE INVENTION

FIGS. 4a to 4i are cross-sections of the method for fabricating S/D devices of the present invention.

Figure 1A:
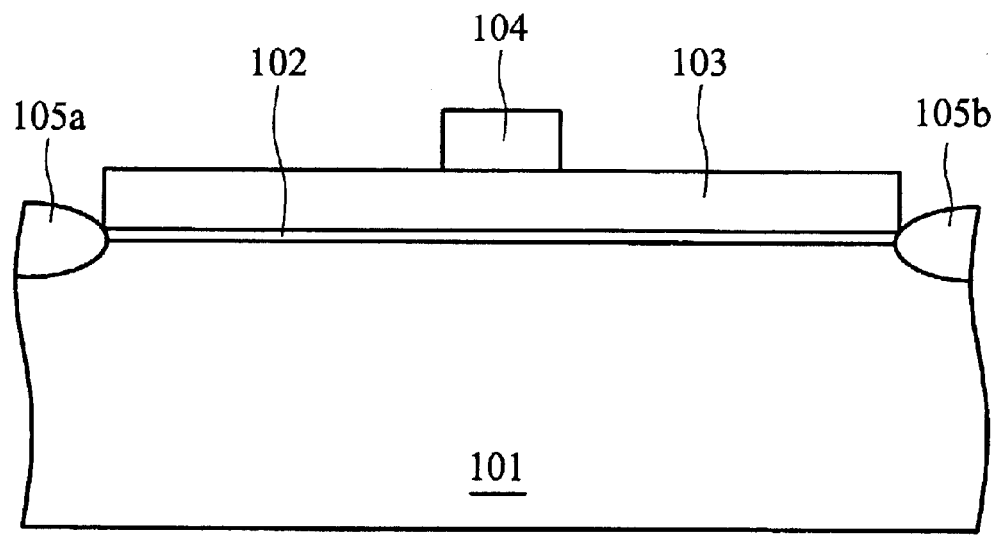
FIGS. 1a to 1i are cross-sections of the conventional method for fabricating S/D devices.
Figure 1B:
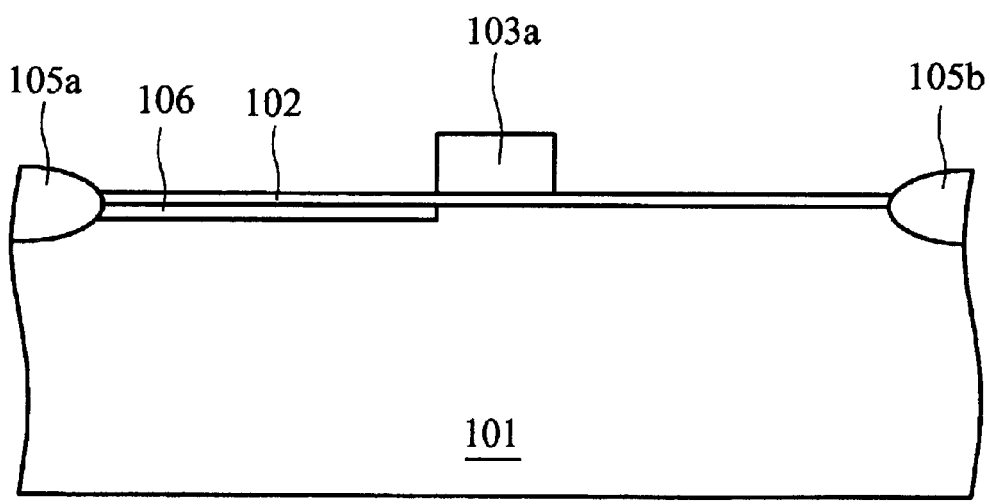
Figure 1C:
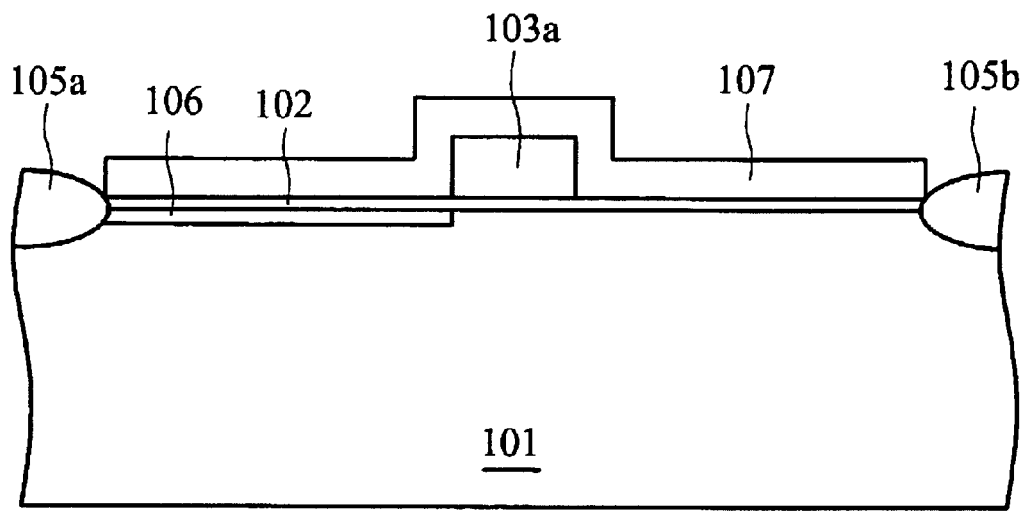
Figure 1D:
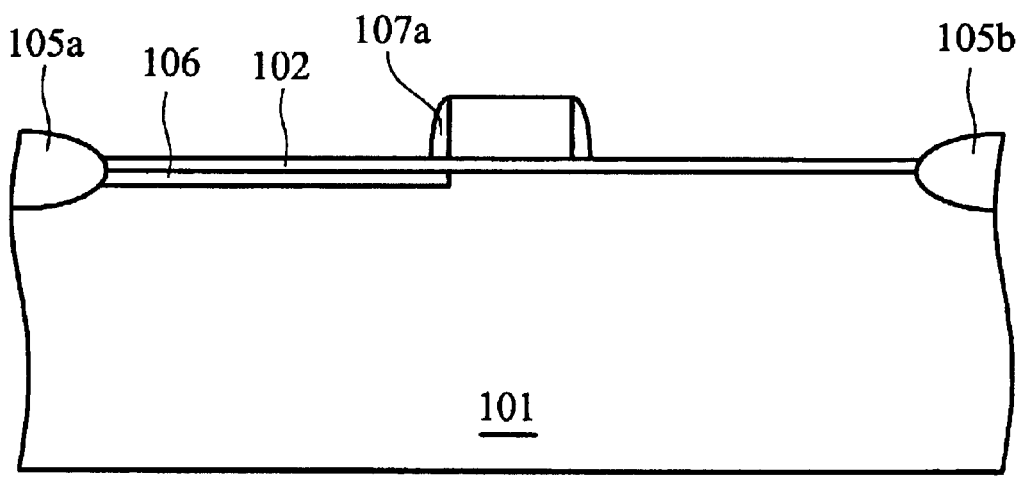
Figure 1E:
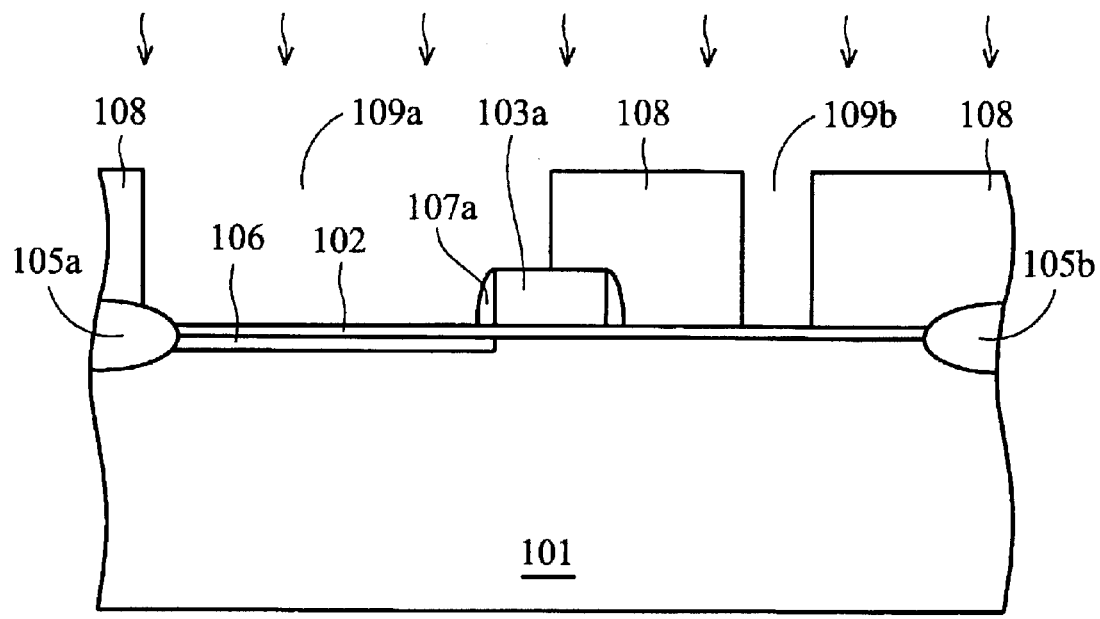
Figure 1F:
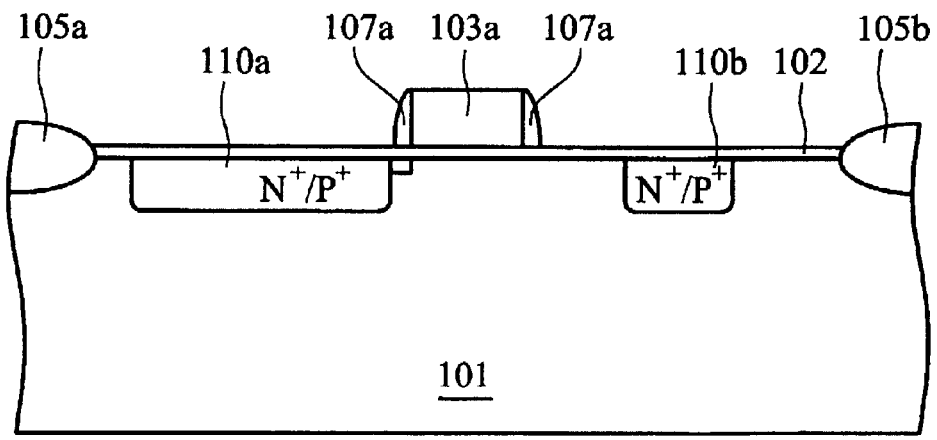
Figure 1G:
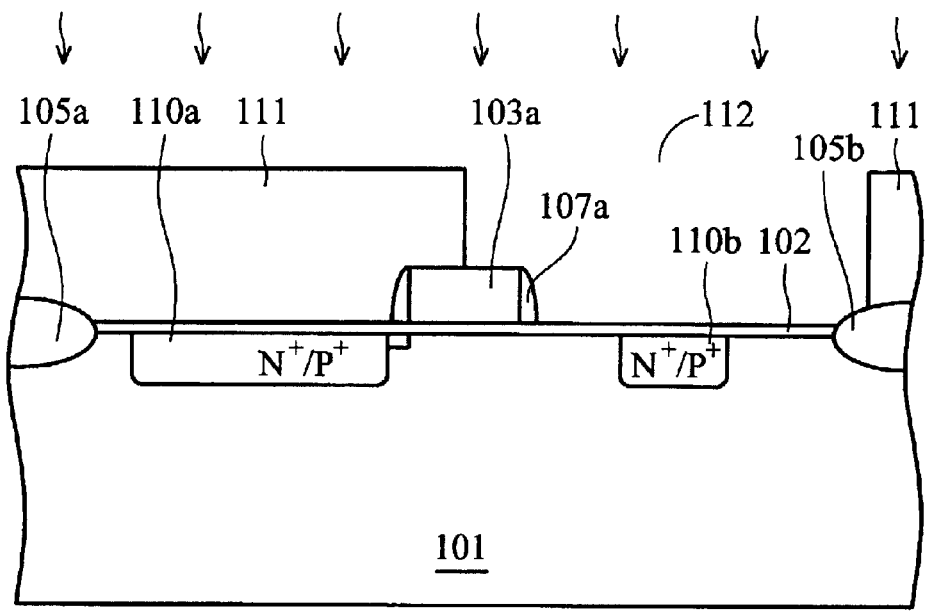
Figure 1H:
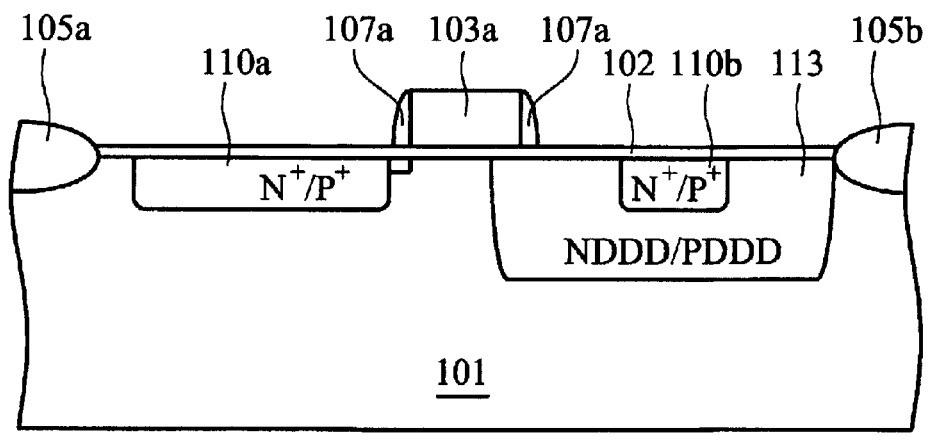
Figure 1I:
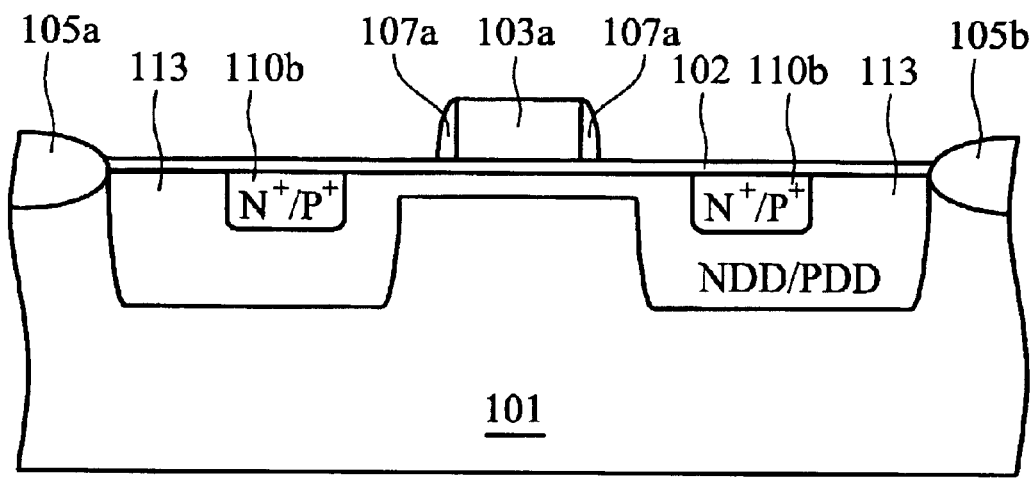
Figure 2:
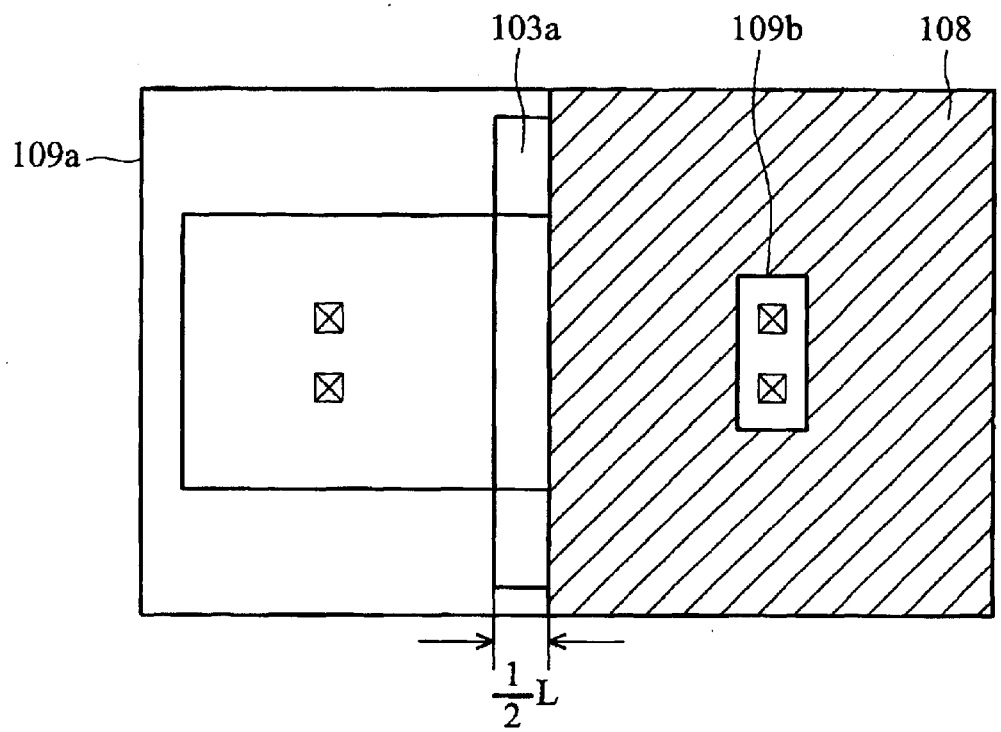
FIG. 2 is a top view of FIG. 1e.
Figure 3:
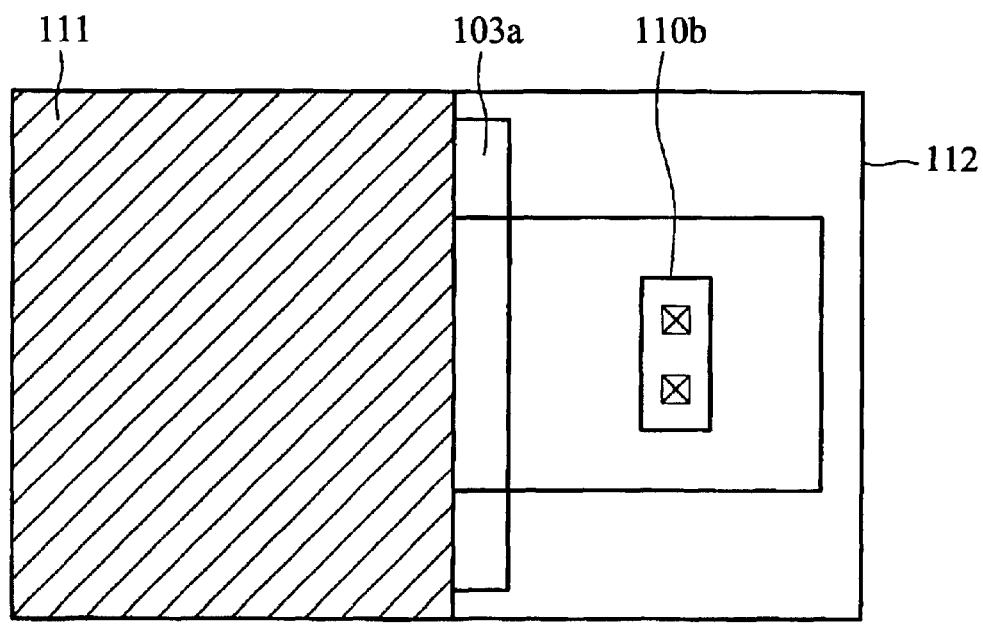
FIG. 3 is a top view of FIG. 1g.
Figure 4A:
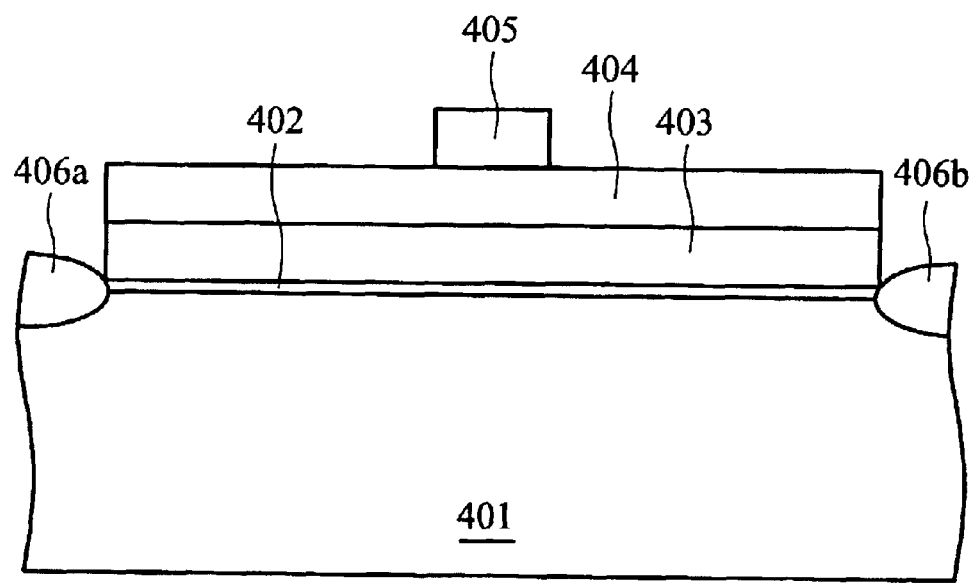
FIGS. 4a to 4i are cross-sections of the method for fabricating S/D devices of the present invention.

In FIG. 4a, first, a semiconductor substrate 401, such as silicon, is provided, and a first isolation area 406a and a second isolation area 406b are formed thereon. A pad layer 402, such as oxide, a conductive layer 403, such as poly, a hard mask layer 404, such as nitride or Tetraethylorthosilicate (TEOS), and a first patterned photo resist layer 405 are sequentially formed on the area between the first isolation area 406a and the second isolation area 406b. The area surrounding by the first isolation area 406a and the second isolation area 406b is regarded as an active area (AA).

Figure 4B:
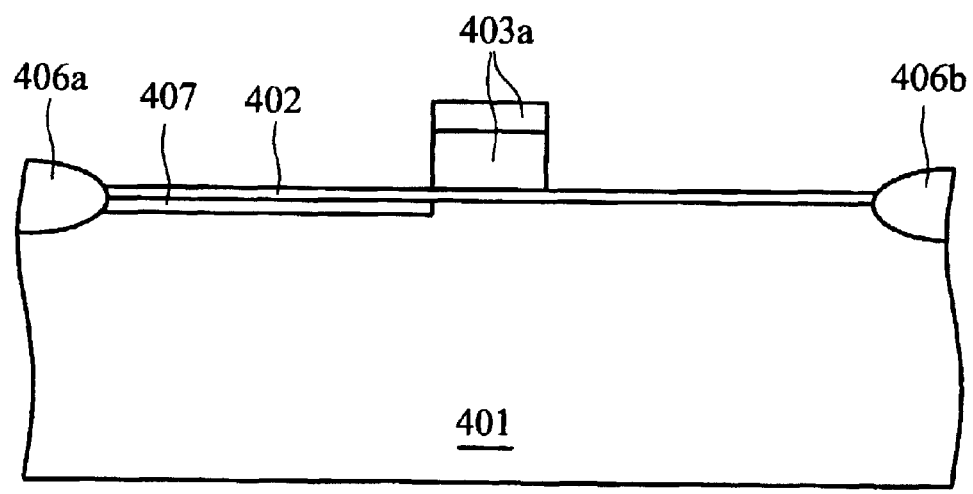

In FIG. 4b, the hard mask layer 404 and the conductive layer 403 are sequentially etched to form a gate 403a using the first patterned photo resist layer 405 as a mask, next, the first patterned photo resist layer 405 is removed, and then, the area of the semiconductor substrate 401 between the gate 403a and the first isolation area 406a is doped to form a lightly doped area 407.

Figure 4C:
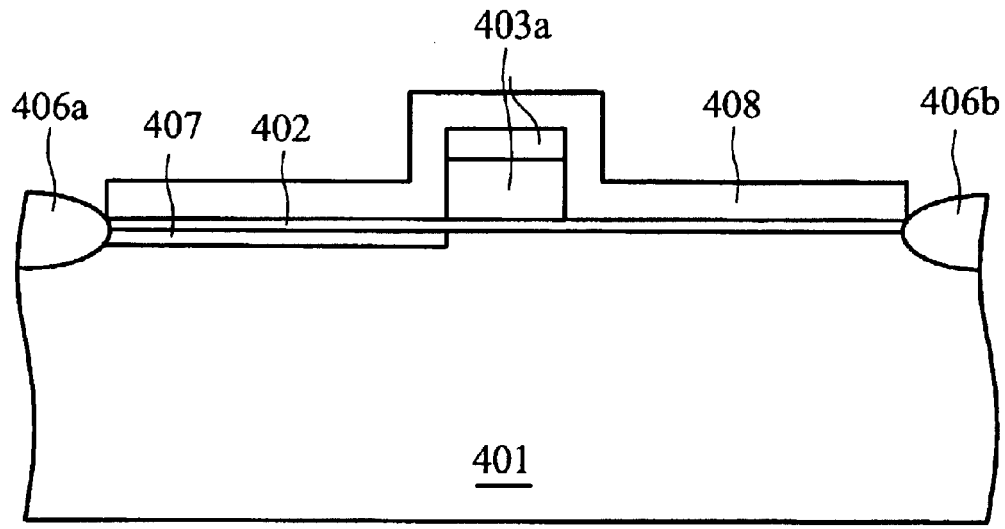

In FIG. 4c, an insulation layer 408, such as nitride, is conformably formed on the surface of the pad layer 402 and the gate 403a.

Figure 4D:
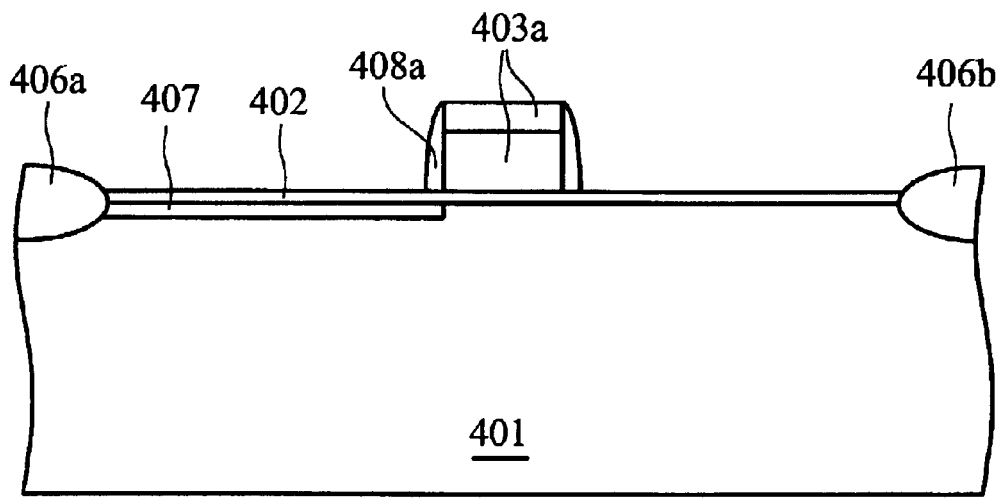

In FIG. 4d, the insulation layer 408 is isotropically etched to form a spacer 408a on the sidewall of the gate 403a.

Figure 4E:
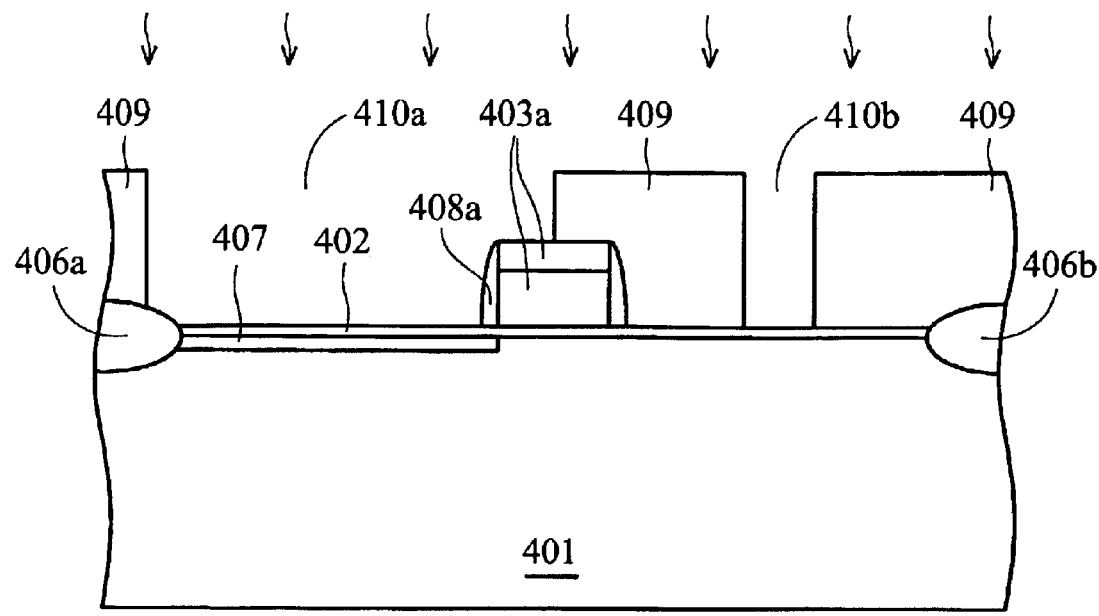

In FIG. 4e, a second patterned photo resist layer 409 having a first opening 410a and a second opening 410b is formed on the semiconductor substrate 401. The first opening 410a is positioned on the area between the gate 403a and the first isolation area 406a, and the second opening 410b is positioned on the area spaced between the gate 403a and the second isolation area 406b.

Figure 5:
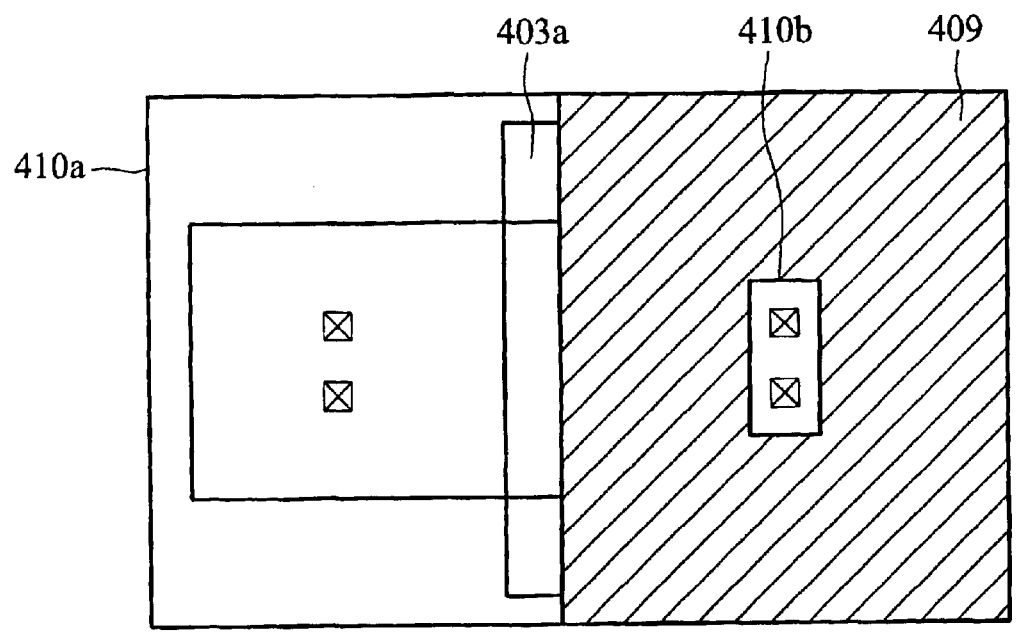
FIG. 5 is a top view of FIG. 4e.

FIG. 5 is the top view of FIG. 4e. In FIG. 5, part of the active area and half the width of the gate 403a are exposed by the first opening 410a in the second patterned photo resist layer 409.

Figure 4F:
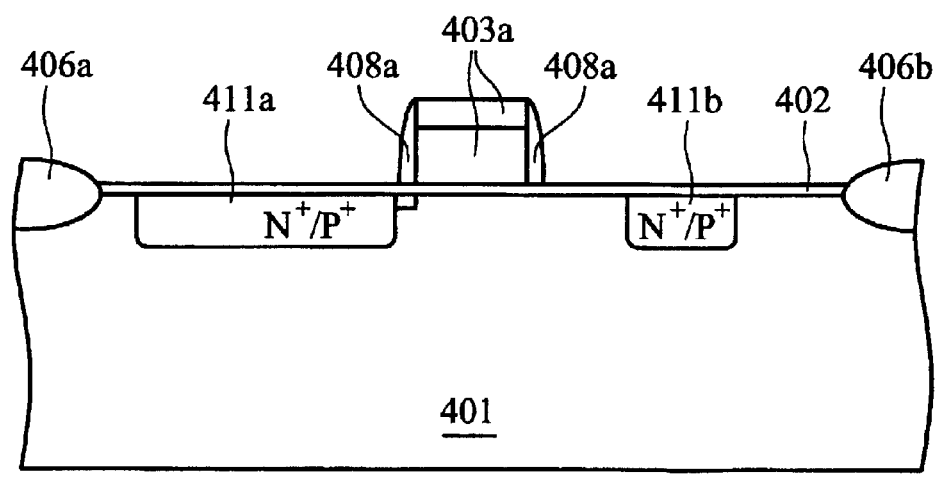

In FIG. 4f, a first doped area 411a is formed at the bottom of the first opening 410a and a second doped area 411b is formed at the bottom of the second opening 410b. After the first ion implantation, the second patterned photo resist layer 409 is removed.

Figure 4G:
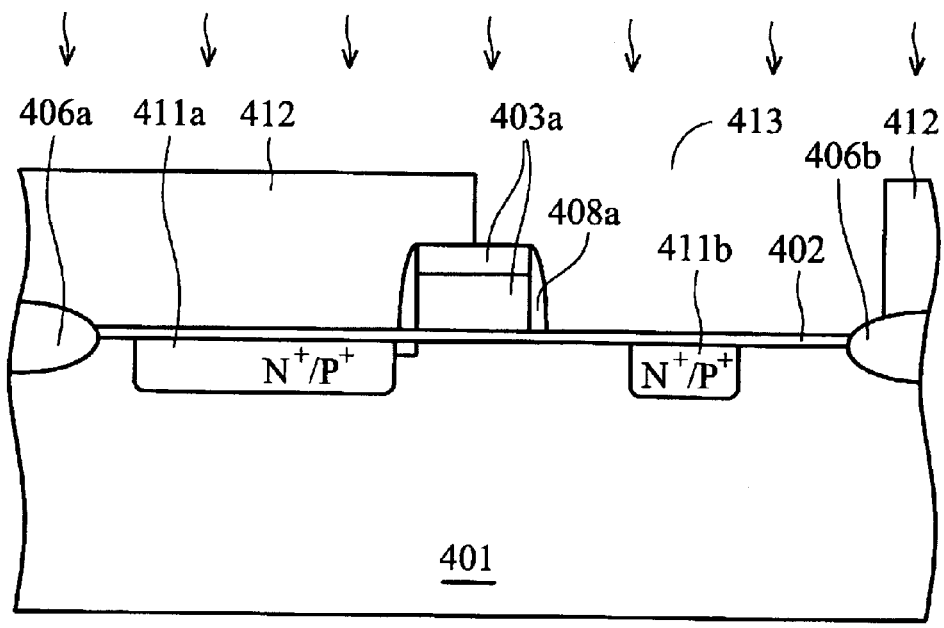

In FIG. 4g, a third patterned photo resist layer 412 having a third opening 413 is formed on the semiconductor substrate 401, and the width of the gate 403a exposing because of the third opening 413 in the third patterned photo resist layer 412 is equal to half the width of the gate 403a. The third opening 413 is positioned on the area between the gate 403a and the second isolation area 406b.

Second ion implantation is performed on the semiconductor substrate 401 using the third patterned photo resist layer 412 and the hard mask layer 404 as masks, and the semiconductor substrate 401 is annealed with As or B ions.

Figure 6:
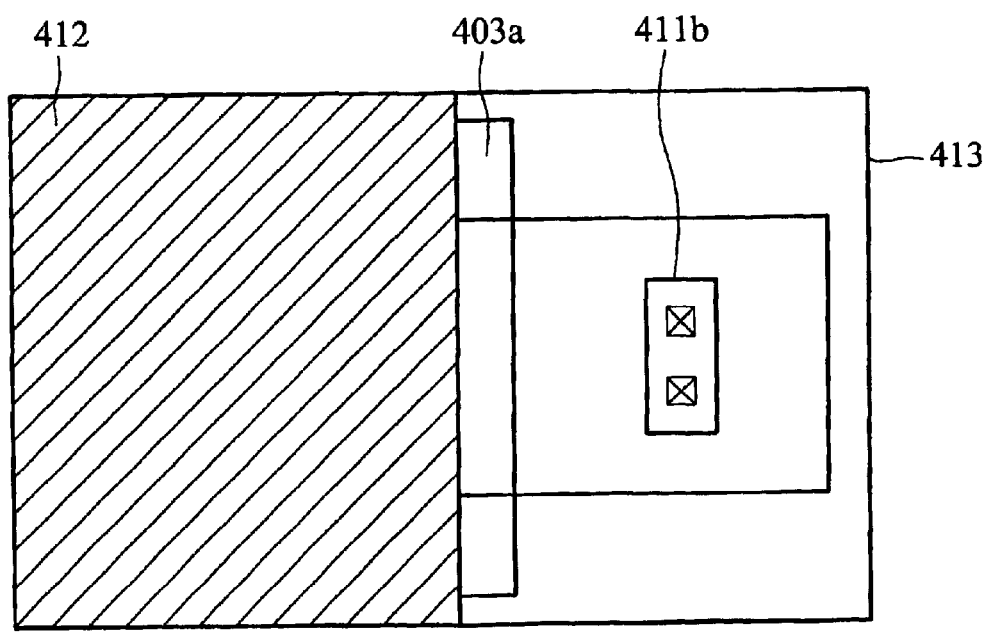
FIG. 6 is a top view of FIG. 4g.

FIG. 6 is a top view of FIG. 4g. In FIG. 4, part of the active area and the width of the gate 403a are exposed by the first opening 413 in the third patterned photo resist layer 411. The width of the first opening 413 is equal to half the width of the gate 403a, and the area between the gate 403a and the first isolative 406a is covered with the third patterned photo resist layer 412.

Figure 4H:
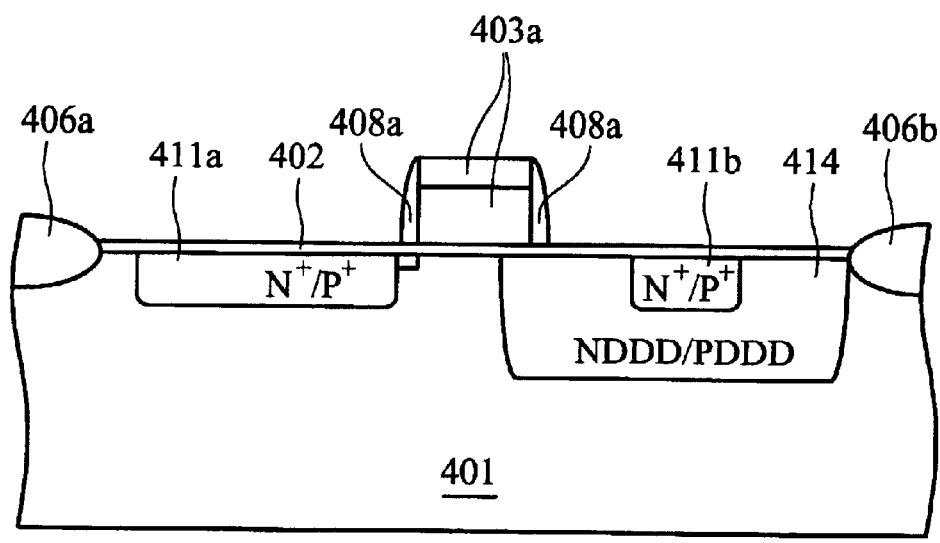
Figure 4I:
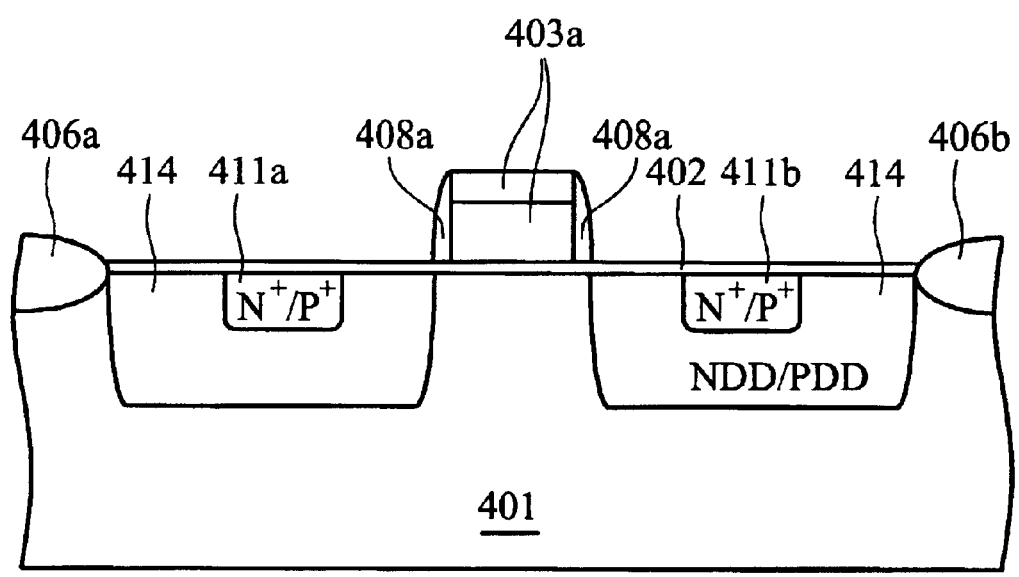

In FIG. 4h, a deeply doped area 414 is formed at the bottom of the third opening 413. After the second ion implantation, the third patterned photo resist layer 412 is removed. The deeply doped area 414 is 6–7 times the depth of the first doped area 411a and the second doped area 411b. The deeply doped area 414 expands after annealing, such that the depth and the width of the deeply doped area 414 are both increased. When the size of the deeply doped area 414 increases, the concentration of dopant inside the deeply doped area 414 decreases and the breakdown voltage of the deeply doped area 414 increases accordingly.

By varying the energy of the ions to form the deeply doped area 414 in the semiconductor substrate 401, the implantation depth into the substrate can be controlled.

When the width of the third opening 413 is equal to half the width of the gate, the high energy ions do not penetrate through the gate 403a and the spacer 408a into the semiconductor substrate 401 because the top layer of the gate 403a is the hard mask layer 404.

When the two SID devices are both deeply doped areas, the channel between the S/D devices below the gate 403a and spacer 408a will not punch through, which means electrons are not injected into the channel from the source region before applying a gate voltage.

The advantage of the present invention is that the channel between the S/D devices below the gate will not punch through, which means the electric field intensity is reduced to avoid the channel short, and breakdown voltage is increased effectively.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating source/drain devices, comprising:

providing a semiconductor substrate having a gate, a Tetraethylorthosilicate (TEOS) layer over the gate, a first doped area on a first side of the gate on the semiconductor substrate, and a second doped area is on a second side of the gate on the semiconductor substrate with spaces between;

forming a patterned photo resist layer on the semiconductor substrate having an opening on the second side of the gate, wherein the width of the exposed gate is equal to half the width of the gate; and implanting and annealing the semiconductor substrate to form a dual diffusion area on the second side of the gate using the patterned photo resist layer and the TEOS hard mask layer as masks.

2. The method for fabricating source/drain devices of claim 1, further comprising removing the patterned photo resist layer.

3. The method for fabricating source/drain devices of claim 1, wherein the semiconductor substrate further comprises a pad layer.

4. The method for fabricating source/drain devices of claim 3, wherein the pad layer is an oxide layer.

5. The method for fabricating source/drain devices of claim 1, wherein the first doped area further comprises a lightly doped area.

6. The method for fabricating source/drain devices of claim 1, wherein the gate has a spacer on the sidewall of the gate.

7. A method for fabricating source/drain devices, comprising:

providing a silicon substrate having a gate, a Tetraethylorthosilicate (TEOS) layer over the gate, a first doped area on a first side of the gate on the silicon substrate, and a second doped area on a second side of the gate on the silicon substrate with spaces between;

forming a patterned photo resist layer on the semiconductor substrate having an opening on the second side of the gate, wherein the width of the exposed gate is equal to half the width of the gate; and implanting and annealing the silicon on substrate to form a dual diffusion area on the second side of the gate using the patterned photo resist layer and the TEOS hard mask layer as masks.

8. The method for fabricating source/drain devices of claim 7, further comprising removing the patterned photo resist layer.

9. The method for fabricating source/drain devices of claim 7, wherein the semiconductor substrate further comprises a pad oxide layer.

10. The method for fabricating source/drain devices of claim 7, wherein the first doping area further comprises a lightly doped area.

11. The method for fabricating source/drain devices of claim 7, wherein the gate has a spacer on the sidewall of the gate.

12. A method for fabricating source/drain devices, comprising:

providing a semiconductor substrate having a pad layer over the semiconductor substrate, a gate formed on the pad oxide layer, a Tetraethylorthosilicate (TEOS) layer over the gate, a first isolation area on a first side of the gate, a second isolation area on a second side of the gate, wherein the gate has a spacer on the sidewall of the gate;

forming a first patterned photo resist layer;

implanting ions into the semiconductor substrate to form a first doped area and a second doped area using the first patterned photo resist layer and the (TEOS) hard mask layer as masks, wherein the first doped area is positioned between the gate and the first isolation area, and the second doped area is positioned between the gate and second isolation area;

removing the first patterned photo resist layer;

forming a second patterned photo resist layer on the semiconductor substrate having an opening on the second side between the gate and the second isolation area, wherein the width of the exposed gate is equal to half the width of the gate;

implanting and annealing the semiconductor substrate using the second patterned photo resist layer as a mask to form a dual diffusion area on the second side of the gate; and removing the second patterned photo resist layer.

13. The method for fabricating source/drain devices of claim 12, wherein the pad layer is an oxide layer.

14. The method for fabricating source/drain devices of claim 12, wherein the first doped area further comprises a lightly doped area.

15. A method for fabricating source/drain devices, comprising:

providing a silicon substrate having a pad oxide layer over the semiconductor substrate, a gate formed on the pad oxide layer, a hard mask layer over the gate, a first isolation area on a first side of the gate, and a second isolation area on a second side of the gate, wherein the gate has a spacer on the sidewall of the gate;

forming a first patterned photo resist layer;

implanting ions into the silicon substrate to form a first doped area and a second doped area using the first patterned photo resist layer and the hard mask layer as masks, wherein the first doped area is between the gate and the first isolation area, and the second doped area is between the gate and second isolation area;

removing the first patterned photo resist layer;

forming a second patterned photo resist layer on the silicon substrate having an opening on the second side between the gate and the second isolation area, wherein the exposed gate is equal to half the width of the gate;

implanting and annealing the silicon substrate using the patterned photo resist layer as a mask to form a dual diffusion area on the second side of the gate; and removing the second patterned photo resist layer.

16. The method for fabricating source/drain devices of claim 15, wherein the first doped area further comprises a lightly doped area.

* * * * *